(12) United States Patent
Young et al.

(10) Patent No.: US 10,794,761 B2
(45) Date of Patent: Oct. 6, 2020

(54) LOGARITHMIC SCALE ANALOG TO DIGITAL CONVERTER FOR WIDE DYNAMIC RANGE AVALANCHE PHOTODIODE CURRENT COMPANDING

(71) Applicant: Linear Technology Holding LLC, Norwood, MA (US)

(72) Inventors: Eric Stephen Young, Apex, NC (US); Qiuzhong Wu, Cary, NC (US); Xin Qi, Cary, NC (US)

(73) Assignee: Linear Technology Holding LLC, Norwood, MA (US)

(*) Notice: Subject to any disclaimer, the term of this patent is extended or adjusted under 35 U.S.C. 154(b) by 6 days.

(21) Appl. No.: 16/186,238

(22) Filed: Nov. 9, 2018

(65) Prior Publication Data
US 2020/0149958 A1 May 14, 2020

(51) Int. Cl.
*G01J 1/44* (2006.01)
*H03M 1/46* (2006.01)
(52) U.S. Cl.
CPC ............. *G01J 1/44* (2013.01); *H03M 1/46* (2013.01); *G01J 2001/4466* (2013.01)

(58) Field of Classification Search
CPC ........ G01J 1/44; G01J 2001/4466; H03M 1/46
See application file for complete search history.

(56) References Cited

U.S. PATENT DOCUMENTS 5,291,238 A * 3/1994 Yasukawa .............. G01J 1/44
250/214 L
2016/0061658 A1* 3/2016 Sugizaki ............... H03F 1/086
250/551

* cited by examiner

*Primary Examiner* — Tony Ko
(74) *Attorney, Agent, or Firm* — Schwegman Lundberg & Woessner, P.A.

(57) ABSTRACT

An electronic circuit comprises an analog-to-digital converter (ADC) circuit. The ADC circuit includes a pre-amplifying transistor and a quantizer circuit. The pre-amplifying transistor includes a base, an emitter and a collector. The pre-amplifying transistor is configured to receive an input voltage at the base that varies logarithmically; and produce an output voltage at the collector according to a comparison of a reference voltage and a difference between the input voltage and a voltage at the emitter. The quantizer circuit is operatively coupled to the pre-amplifying transistor and is configured to generate a digital value for the input voltage using the output voltage produced by the pre-amplifying transistor.

21 Claims, 4 Drawing Sheets

LOGARITHMIC SCALE ANALOG TO DIGITAL CONVERTER FOR WIDE DYNAMIC RANGE AVALANCHE PHOTODIODE CURRENT COMPANDING

FIELD OF THE DISCLOSURE

This document relates to integrated circuits and in particular to monitoring current produced using an avalanche photodiode (APD).

BACKGROUND

Avalanche Photodiodes (APDs) are used to convert an optical signal into an electrical signal, such as for an optical receiver for example. APD current can be used as an indication of optical signal strength. For this reason, it is desirable to have a real-time measurement of the APD current to monitor performance of the APD. However, the dynamic range of the current produced by an APD may be 10,000 to 1. This large dynamic range can make it challenging to design circuits to track APD current.

SUMMARY OF THE DISCLOSURE

This document relates generally to current monitoring circuits and methods of their operation. In some aspects, an electronic circuit includes an analog-to-digital converter (ADC) circuit. The ADC circuit includes a pre-amplifying transistor and a quantizer circuit. The pre-amplifying transistor includes a base, an emitter and a collector. The pre-amplifying transistor is configured to receive an input voltage at the base that varies logarithmically; and produce an output voltage at the collector according to a comparison of a reference voltage and a difference between the input voltage and a voltage at the emitter. The quantizer circuit is operatively coupled to the pre-amplifying transistor and is configured to generate a digital value for the input voltage using the output voltage produced by the pre-amplifying transistor.

In some aspects, a method of operating a current monitoring circuit includes applying a logarithmically varying input voltage to a base of a pre-amplifying transistor, applying an output voltage from a digital-to-analog converter (DAC) circuit to an emitter of the pre-amplifying transistor, applying a reference current source to a collector of the pre-amplifying transistor to establish a threshold voltage and to pull a collector voltage at the collector to a high supply voltage, wherein the collector voltage is pulled down to a low supply voltage when a difference between the logarithmically varying input voltage and the output voltage from the DAC circuit is greater than the established threshold voltage, and generating a digital value for the logarithmically varying input voltage using the collector voltage as an input to a quantizer circuit that includes the DAC circuit.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As explained previously herein, APDs are useful to convert an optical signal into an electrical signal, but the dynamic range of the current of the APDs create challenges in the design of circuits to monitor the performance of the APDs. One approach to address the large dynamic range is to convert the current of the APD into a voltage signal in logarithmic scale. This logarithmic current-to-voltage (I2V) conversion compresses or compands the wide dynamic range of the current for quantization. A logarithmic I2V conversion is more attractive than a linear I2V conversion for APD current monitoring. For example, with a logarithmic I2V an 8-bit quantizer can achieve 3.663% relative accuracy across a four decades input range, while for a linear I2V conversion an 18-bit quantizer is needed to have the same accuracy.

Due to its exponential I-V characteristics, an NPN type bipolar transistor ("NPN transistor") can be used as an I2V converter. For example, a transconductance amplifier based on the logarithmic I-V characteristic of an NPN transistor can achieve the I2V conversion on a logarithmic scale. However, processing of the logarithmic voltage may require an external or off-chip analog-to-digital converter (ADC) circuit. The multiple chip solution may be too large for some applications. For example, applications in optical communications often need a compact and complete APD bias solution within a tight available module space (e.g., a four millimeter by four-millimeter (4×4 mm) quad flat no-leads (QFN) package). The available space may need to accommodate integrated monolithic power switchers and an accurate ADC for wide dynamic range APD current companding. The limited layout space and noisy environment due to internal power switches raise more challenges for an ADC circuit design needed to cover the wide dynamic range input with acceptable accuracy.

Figure 1:
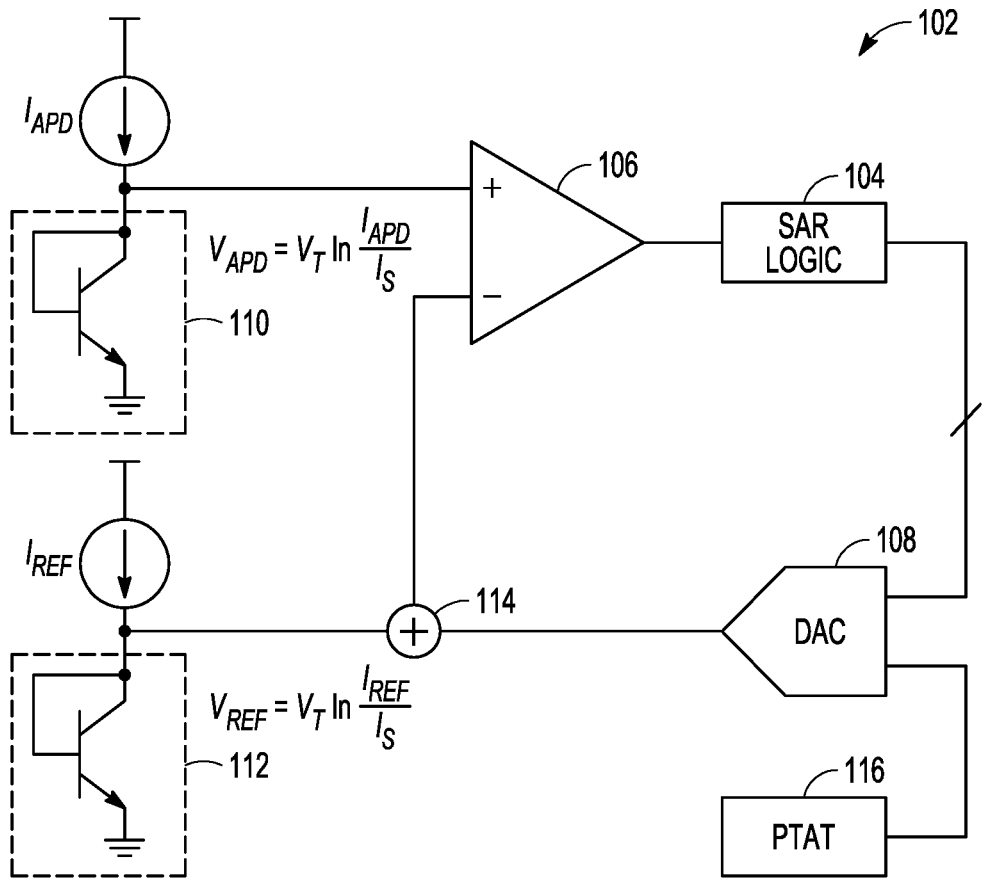
FIG. 1 is a circuit diagram of an example of a logarithmic scale current mode analog-to-digital converter (ADC) circuit.

FIG. 1 is a circuit diagram of an example of a logarithmic scale current mode ADC circuit that is suitable for APD current monitoring and is small enough be integrated with an APD driver. The ADC circuit 102 has a successive approximation register (SAR) topology and includes SAR logic circuitry 104, a comparator 106, and a digital-to-analog converter (DAC) circuit 108.

Because the sampling rate for applications such as APD current monitoring can be relatively slow, the SAR topology can be used due to its simplicity and small size. The APD is represented by current source $I_{APD}$. The APD current $I_{APD}$ is fed to a first diode-connected NPN transistor for I2V conversion. The base of the first diode-connected NPN transistor 110 is connected to its collector. The base voltage of the first diode-connected NPN transistor 110, which represents $I_{APD}$, is connected to the positive input of the analog voltage comparator. The reference current $I_{REF}$, which reflects the lower limit of the APD current range, is converted to a voltage using a second diode-connected NPN transistor 112. The base voltage $I_{REF}$ represents the current $I_{REF}$ and is summed with the output of the DAC circuit using analog voltage adder 114, and is connected to the negative input of the comparator 106. In the layout of the circuit, the two diode-connected NPN transistors 110 and 112 can be placed close to each other to achieve good matching.

The SAR logic circuitry 104, the comparator 106, and the DAC circuit 108 convert the input voltage, and thus the APD current, into a digital value. The DAC circuit 108 generates an output voltage that is proportional to a digital code and the DAC reference voltage ($V_{DAC\_REF}$). In certain aspects, the DAC circuit can be a resistive R-2R ladder circuit. The conversion may start with the DAC circuit 108 set to midscale. The comparator 106 determines whether the $V_{APD}$ input or ($V_{REF}$+DAC) input is greater, and the result (the most-significant bit (MSB) of the conversion) is stored in a register of the SAR logic as a 1 or a 0. The DAC circuit 108 may then be set either to ¼ scale or ¾ scale (depending on the determined value of the MSB), and the comparator makes the decision for the second bit of the conversion. The result (1 or 0) is stored in the register, and the process continues until all bit values of the digital code have been determined.

When the analog-to-digital (A/D) conversion process is complete, the ADC circuit 102 produces a digital code representing $I_{APD}$ as:

$$\text{Code} = \text{floor}\left(\frac{V_{APD} - V_{REF}}{\frac{V_{DAC\_REF}}{m2^n}}\right) \quad (1)$$

where n is the ADC's resolution in bits, and m represents the DAC reference voltage to full scale DAC output voltage ratio. $V_{APD}$ and $V_{REF}$ are the voltages representing $I_{APD}$ and $I_{REF}$, respectively, and $V_{DAC\_RFF}$ is the DAC reference voltage. The floor function floor(x) outputs the greatest integer number less than or equal to the input x to the function.

A diode-connected NPN transistor generates a temperature dependent voltage when it is used as an I2V converter, as:

$$\begin{cases} V_{ADP} = V_T \ln\frac{I_{APD}}{I_S} = \frac{kT}{q}\ln\frac{I_{APD}}{I_S} \\ V_{REF} = V_T \ln\frac{I_{REF}}{I_S} = \frac{kT}{q}\ln\frac{I_{REF}}{I_S} \end{cases} \quad (2)$$

where T is the absolute temperature, $I_S$ is the saturation current of the NPNs To generate a DAC output that can track the temperature dependency of $I_{REF}$ and $I_{APD}$, a proportional to absolute temperate (PTAT) voltage source 116 can be included as the reference voltage for the DAC. To cover the full APD current range, the PTAT voltage should be set as $V_{PTAT}=V_T*m*\ln k$, where k is the input current dynamic range ratio. For example, $V_{PTAT}=V_T*2*\ln 10000=8*\ln 10*V_T$ if the input current dynamic range is 10,000:1 and the full-scale DAC output voltage is half of the reference voltage.

With the PTAT voltage source as the DAC reference voltage, the ADC produces a temperature independent digital code when the A/D conversion is complete as:

$$\text{Code} = \text{floor}\left(\frac{V_{APD} - V_{REF}}{\frac{V_{DAC\_REF}}{m2^n}}\right) = \quad (3)$$

$$\text{floor}\left(\frac{V_T \ln\frac{I_{APD}}{I_S} - V_T\ln\frac{I_{REF}}{I_S}}{V_T m \ln k/m2^n}\right) = \text{floor}\left(2^n \frac{\ln\frac{I_{APD}}{I_{REF}}}{\ln k}\right).$$

The overall A2D accuracy is mainly determined by the accuracy of the comparator 106, and the analog voltage adder 114. To sum up the voltages produced by a non-ideal voltage source without introducing errors, either an analog voltage adder with high impedance inputs is needed, or buffers are needed to isolate the non-ideal voltage sources from the inputs to the analog adder. Either solution would increase the circuit complexity and increase the circuit area, which is not practical for integrating an ADC monitoring circuit with an APD driver. In addition, for a logarithmic I2V conversion, one least significant bit (LSB) represents 3.663% relative difference between bits when four decades APD current is quantized into an 8-bit digital code. After the I2V conversion, a 3.663% relative current difference results in $V_T$ ln 1.03663≈0.930 mV overall A2D accuracy is mainly determined by the accuracy of two critical blocks, namely, the analog voltage comparator, and the analog voltage adder.

To sum up the voltages produced by non-ideal voltage source without introducing errors, either an analog voltage adder with high impedance inputs is needed, or buffers are needed to isolate the voltage sources from the analog adder inputs. Either approach would increase the circuit complexity and require extra layout area, which is not practical to be integrated with a monolithic switcher. In addition, for a logarithmic I2V conversion, one LSB represents 3.663% relative difference when four decades APD current is quantized into an 8-bit digital code. After I2V conversion, a 3.663% relative current difference results in $V_T$ ln 1.03663≈0.930 millivolts (0.930 mV) relative voltage difference at room temperature. To achieve that resolution, a comparator with offset less than 0.5 LSB, (i.e., 0.465 mV) is needed for the quantization.

An improved approach with reduced circuit area can be implemented if more functionality is incorporated into the NPN transistors. With the proper circuit configuration, an NPN transistor can function as both an amplifier and a comparator for an APD current monitoring circuit.

Figure 2:
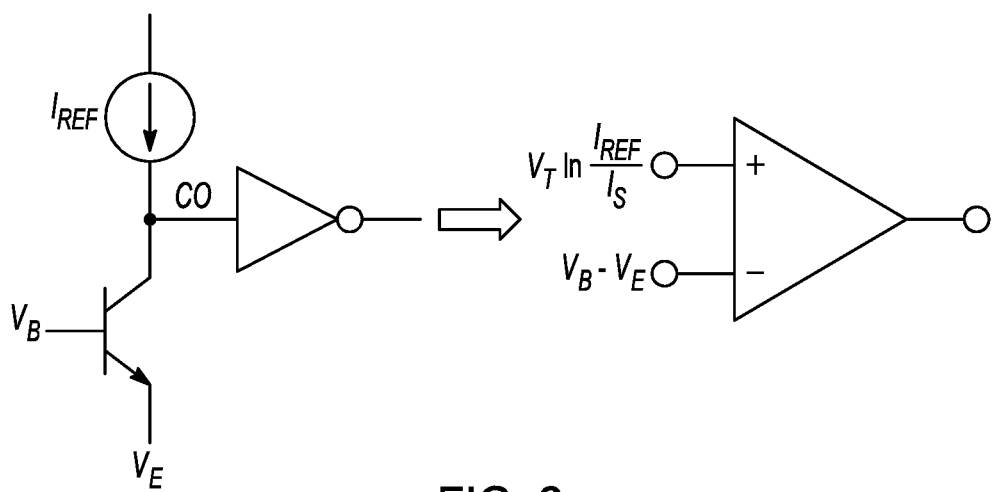
FIG. 2 is a circuit schematic of a single NPN-type bipolar transistor operating as a comparator.

FIG. 2 is a circuit schematic useful to show a single NPN transistor operating as a comparator. The collector of the NPN transistor shown on the left in FIG. 2 is connected to a circuit node labeled "CO." A current source $I_{REF}$ pulls the circuit node "CO" up while the collector current set by the voltage difference between the base and the emitter ($V_B$-$V_E$) pulls the circuit node "CO" down. If the voltage difference $V_B$-$V_E$ is larger than the threshold set by the reference current $I_{REF}$ $$\left(\text{i.e., } V_T \ln\frac{I_{REF}}{I_S}\right),$$

the pull-down current is higher than the pull-up current and node CO is pulled to low; otherwise, the circuit node "CO"

stays high. This functionality is represented as the comparator shown on the right in FIG. 2.

When the base of the NPN transistor is tied to the I2V converter of the APD current, and the emitter voltage of the NPN transistor is forced to the DAC circuit output, NPN transistor would output a high at circuit node "CO" if $$V_{BE} = V_B - V_E = V_T \ln\frac{I_{APD}}{I_S} - V_{DAC} > V_T \ln\frac{I_{REF}}{I_S}. \quad (4)$$

Equation (4) can be rearranged as $$V_T \ln\frac{I_{APD}}{I_S} > V_{DAC} + V_T \ln\frac{I_{REF}}{I_S}. \quad (5)$$

That is, the logarithmic I2V converter for the reference current, the analog adder, and a preamplifier of the analog comparator in FIG. 1 can be merged into a single NPN transistor. This relaxes the offset requirement of the comparator 106 of the circuit of FIG. 1 and significantly simplifies the complexity of the logarithmic scale current mode ADC circuit without losing accuracy.

Figure 3:
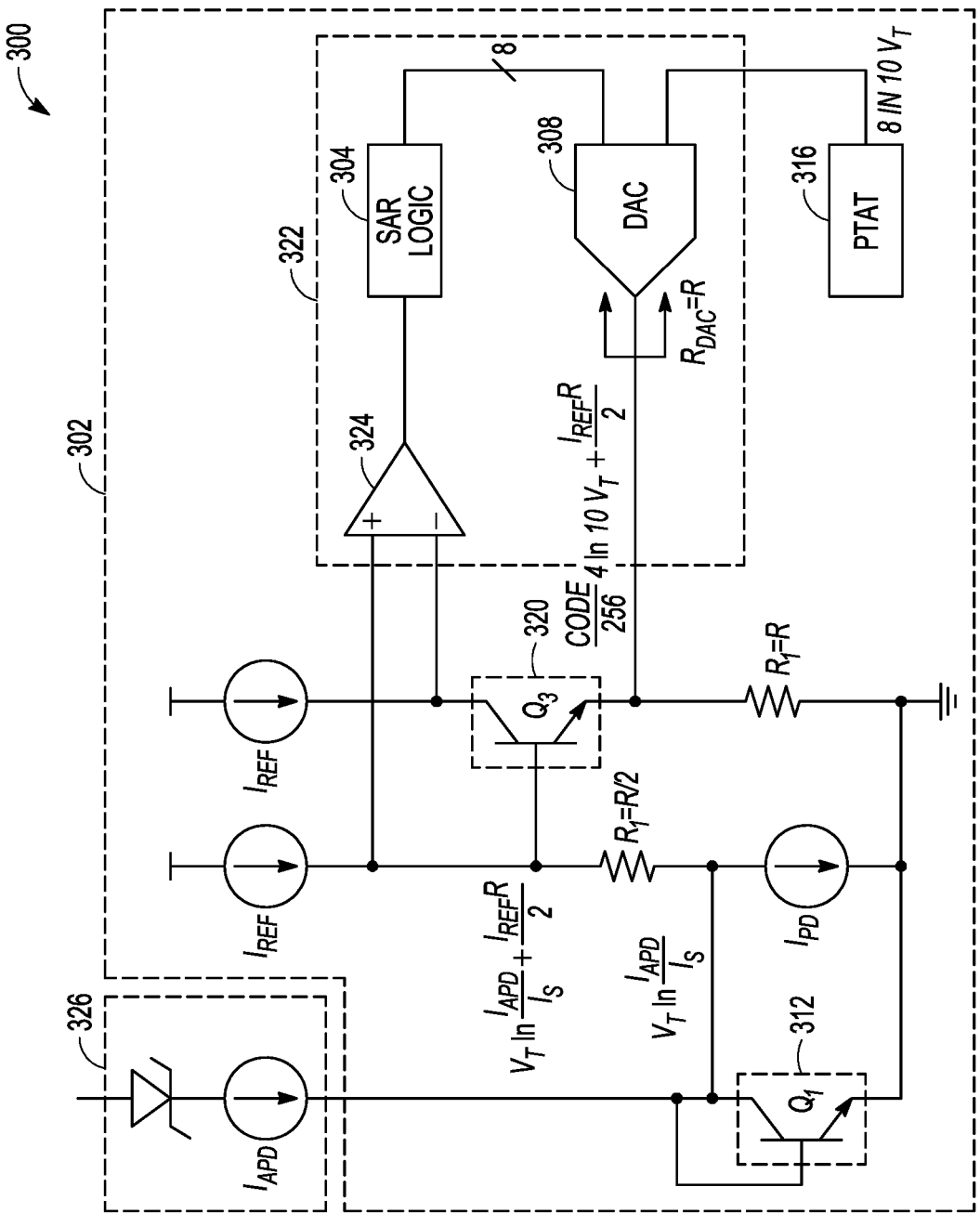
FIG. 3 is a circuit diagram of an example of an electronic circuit that includes a logarithmic scale current mode ADC circuit.

FIG. 3 is a circuit diagram of an example of an electronic circuit 300 that includes a logarithmic scale current mode ADC circuit. The ADC circuit 302 includes a pre-amplifying transistor 320 ($Q_3$) and a quantizer circuit 322. The pre-amplifying transistor 320 may be an NPN transistor that includes a base, an emitter and a collector. The pre-amplifying transistor 320 receives an input voltage at the base that varies logarithmically. The input voltage can be derived from the current output of an APD. The pre-amplifying transistor 320 produces an output voltage at the collector according to a comparison of a reference voltage (e.g., $V_{REF}$) and a difference between the input voltage at the base and a voltage at the emitter of the pre-amplifying transistor (e.g., a $V_{BE}$ voltage). The pre-amplifying transistor 320 combines the functionality of the logarithmic I2V converter for the reference current $I_{REF}$, the analog adder 114, and the preamplifier of the comparator 106 of the example of FIG. 1.

The quantizer circuit 322 is operatively coupled to the pre-amplifying transistor 320 (e.g., at one or both of the collector and the emitter) and generates a digital value for the input voltage using the output voltage produced by the pre-amplifying transistor 320. In the example of FIG. 3, the quantizer circuit 322 is an 8-bit SAR converter circuit that includes SAR logic circuitry 304, DAC circuit 308, and comparator 324. Because some of the functionality of a comparator is off-loaded to the pre-amplifying transistor 320, the comparator 324 of the quantizer circuit 322 can be less complex and occupy less area than the comparator 106 of FIG. 1.

FIG. 3 also shows an APD 326 connected to a diode-connected transistor 312 ($Q_1$). The diode-connected transistor 312 can be a second NPN transistor with the base of the transistor coupled to the collector of the transistor. The diode-connected transistor 312 provides the I2V conversion of the current of the APD to generate the input voltage at the base of pre-amplifying transistor 320. The voltage produced by the diode-connected transistor 312 varies logarithmically with the APD current, and the voltage is representative of the APD current compressed logarithmically.

The output of the DAC circuit 308 is coupled to the emitter of the pre-amplifying transistor, and thus the voltage $V_{BE}$ of the transistor is the difference between the input voltage at the base and the output of the DAC circuit at the emitter. A current reference $I_{REF}$ is connected to the base of the pre-amplifying transistor and a resistive circuit element 328.

Q1 and Q3 are matching NPN transistors. The ADC circuit 302 also includes a resistive circuit element $R_2$ coupled to the emitter of the pre-amplifying transistor 320 and an output of the DAC circuit 308. $R_2$ serves as the load of the DAC and is set equal to the output impedance of the DAC ($R_2=R=R_{DAC}$). The ADC circuit 302 also includes a proportional to absolute temperature (PTAT) voltage reference 316 coupled to an input of the DAC circuit. The PTAT voltage can be chosen as $V_{PTAT}=8*\ln 10*V_T$ since in is 2.

The DAC output voltage is tied to the emitter of $Q_3$. Because reference current $I_{REF}$ is typically low and the input effective impedance looking into the emitter of $Q_3$ emitter is relative high, the voltage at the $Q_3$ emitter is mainly forced by the DAC output connected to the emitter. However, current $I_{REF}$ passes through the DAC load resistor $R_2$ before it returns to ground, which efficiently lifts up the $Q_3$ emitter's potential by $$I_{REF}\frac{R_2}{2}$$

on top of the DAC output voltage (noting that $R_2$ equals the output impedance of the DAC).

To cancel this extra voltage shifting, a voltage shifter is coupled to the base of the pre-amplifying transistor. The voltage shifting circuit includes resistor $R_1(=R_2/2=R/2)$ and pull down current sink $I_{PD}(I_{PD}=I_{REF})$. By selecting $R_1=R_2/2$, the voltage shifting at both the emitter and the base of Q3 can cancel each other, as:

$$V_{BE3} = \quad (6)$$
$$V_{B3} - V_{E3} = V_T \ln\frac{I_{APD}}{I_S} + I_{REF}R_1 - \left(\frac{\text{Code}}{256}4\ln 10 V_T + I_{REF}\frac{R_2}{2}\right) =$$
$$V_T \ln\frac{I_{APD}}{I_S} - \frac{\text{Code}}{256}4\ln 10 V_T.$$

The digital code generated by the A/D conversion of ADC circuit 302 is $$\text{Code} = \text{floor}\left(64\frac{\ln\frac{I_{APD}}{I_{REF}}}{\ln 10}\right). \quad (7)$$

The current of the APD can vary over decades of a logarithmic scale (e.g., 10,000:1). The 8-bit digital values produced by the logarithmic scale current mode ADC circuit are logarithmically compressed values of the APD current.

Figure 4:
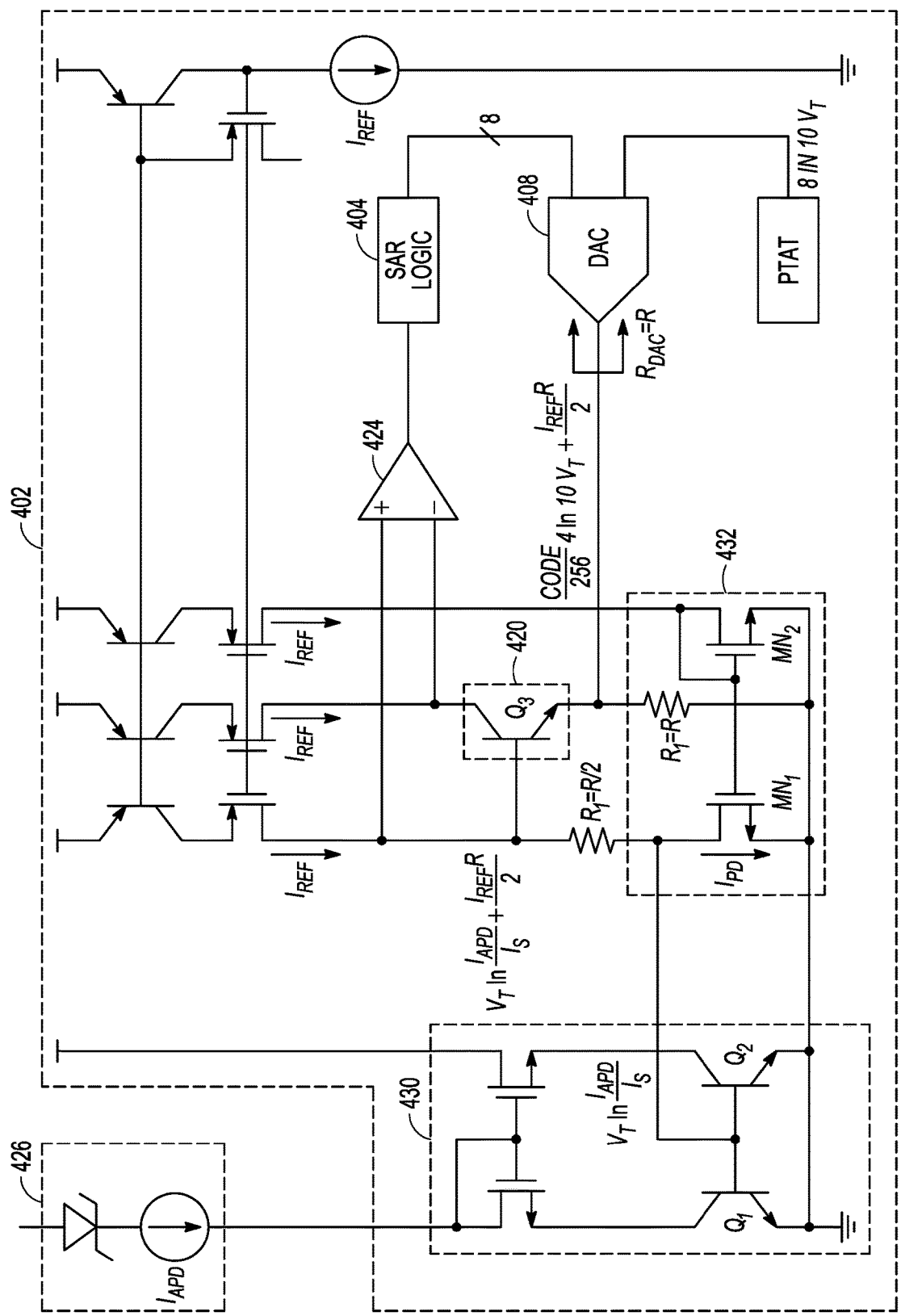
FIG. 4 is a circuit diagram of another example of an electronic circuit that includes a logarithmic scale current mode ADC circuit.

FIG. 4 is a circuit diagram of another example of an electronic circuit 400 that includes a logarithmic scale current mode ADC circuit. The ADC circuit 402 includes a pre-amplifying transistor 420, and an 8-bit SAR converter circuit that includes SAR logic circuitry 404, DAC circuit 408, and comparator 424. The ADC circuit 402 of FIG. 4 improves the accuracy of the current-to-voltage conversion of the example of FIG. 3. The ADC circuit of FIG. 4 includes a first current mirror circuit 430 operatively coupled to the APD 426, and a second current mirror circuit 432. The first current mirror circuit is a Wilson current mirror circuit and includes a diode-connected NPN transistor $Q_2$ that provides the input voltage to the pre-amplifying transistor $Q_3$. The second current mirror circuit 432 is connected to the first current mirror circuit 430 and the voltage shifter circuit that includes $R_1$. The second current mirror circuit 432 includes n-type field effect (NFET) transistors $MN_1$ and $MN_2$. The pull down current $I_{PD}$ passes through transistor $MN_1$ and is mirrored in $MN_2$.

The APD current is fed to the collector of $Q_1$, that is one leg of the Wilson current mirror, and the base current of $Q_1$ comes from the other leg of the Wilson current mirror (NPN transistor $Q_2$). In this way, the conversion error due to the finite current gain ($\beta_F$) of the NPN transistor can be reduced. In addition, the Wilson current mirror has a cascade topology that keeps the collector voltage of $Q_1$ close to the base voltage regardless the APD current. This can suppress the Early Effect and provide improved accuracy in the current-to-voltage conversion.

Figure 5:
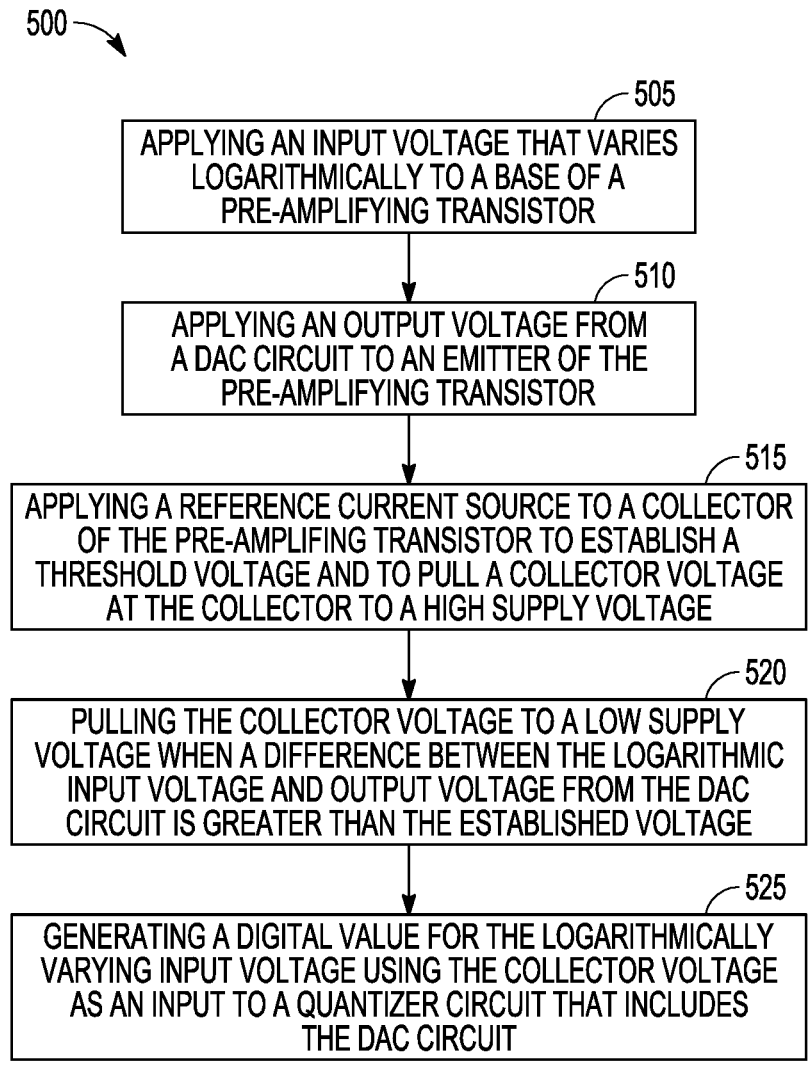
FIG. 5 is a flow diagram of a method of operating a current monitoring circuit.

FIG. 5 is a flow diagram of a method 500 of operating a current monitoring circuit. At 505, an input voltage that varies logarithmically is applied to a pre-amplifying transistor. The input voltage may be a voltage generated by a current-voltage conversion of current generated using an APD, and the generated voltage varies logarithmically with the APD current. The pre-amplifying transistor may be an NPN-type bipolar transistor having a base, emitter and collector, and the input voltage is applied to the base of the transistor.

At 510, an output voltage from a DAC circuit is applied to the emitter of the pre-amplifying circuit. The voltage difference between the base and emitter ($V_{BE}$) is equal to the difference between the logarithmic input voltage and the output voltage from the DAC circuit. The pre-amplifying transistor function as both a pre-amplifier and a comparator for the current monitoring circuit. At 515, a reference current source is applied to the collector of the pre-amplifying circuit to establish a threshold voltage and to pull a collector voltage at the collector to a high supply voltage. At 520, the collector voltage is pulled down to a low supply voltage when the $V_{BE}$ voltage is greater than the established threshold voltage and is pulled to the high supply voltage when $V_{BE}$ is less than the established threshold voltage.

At 525, a digital value is generated for the logarithmically varying input voltage using the collector voltage as an input to a quantizer circuit that includes the DAC circuit. In the example of the APD, the APD current may vary over four decades of a logarithmic current scale. The digital values produced by the current monitoring circuit are logarithmically compressed digital values of the APD current.

As shown in the described examples, the ADC circuit can be an 8-bit Logarithmic Scale current ADC. A logarithmic conversion is performed before quantization to the 8-bit digital values to compress a wide input current range (e.g., current of an APD). Thus, 3.663% relative accuracy is achieved with an 8-bit quantizer for four decades of input current range.

The ADC circuit topology presented merges the reference current I2V converter, the analog adder, and a preamplifier of the analog comparator into a single NPN transistor. This relaxes the offset requirement of the analog voltage comparator and simplifies the system complexity significantly without losing accuracy. The circuit topology is less sensitive to noisy environment and simple to implement, which can be easily integrated with monolithic power switchers. The circuit topology and the use of the companding ADC function allows for a serial interface to be used for setting and read back of digital thresholds for adjustment of the high and low current compliance on the APD current ($I_{APD}$), and setting and read back of gain trim to adjust for APD aging and temperature drift. The high current compliance of the circuit topology protects the APD from damage due to optical saturation and consequently reaching current limit, and the low current compliance detects loss-of-optical-signal which is needed to improve communications channel reliability.

Additional Description and Aspects

Aspect 1 can include subject matter (such as an electronic circuit) comprising an analog-to-digital converter (ADC) circuit. The ADC circuit includes a pre-amplifying transistor and a quantizer circuit. The pre-amplifying transistor includes a base, an emitter and a collector, and is configured to receive an input voltage at the base and produce an output voltage at the collector according to a comparison of a reference voltage and a difference between the input voltage and a voltage at the emitter. The quantizer circuit is operatively coupled to the emitter of the pre-amplifying transistor and configured to generate a digital value for the input voltage using the output voltage produced by the pre-amplifying transistor.

In Aspect 2, the subject matter of Aspect 1 optionally includes an avalanche photodiode (APD); and a diode-connected transistor operatively coupled to the APD and configured to receive current produced by the APD and generate the input voltage received at the base of the pre-amplifying transistor, wherein the input voltage varies logarithmically with the current produced by the APD.

In Aspect 3, the subject matter of one or both of Aspects 1 and 2 optionally includes a quantizer circuit includes a successive approximation register (SAR) converter circuit.

In Aspect 4, the subject matter of Aspect 3 optionally includes SAR converter circuit that includes a digital-to-analog converter (DAC) circuit. The DAC circuit includes a DAC output operatively coupled to the emitter of the pre-amplifying transistor. The pre-amplifying circuit is optionally configured to produce the output voltage using a difference between the input voltage and a DAC output voltage.

In Aspect 5, the subject flatter of Aspect 4 optionally includes a resistive circuit element coupled to the emitter of the pre-amplifying transistor and an output of the DAC circuit, and a voltage shifter circuit coupled to the base of the pre-amplifying transistor.

In Aspect 6, the subject matter of one or both of Aspects 4 and 5 optionally includes a proportional to absolute temperature (PTAT) voltage reference coupled to an input of the DAC circuit.

In Aspect 7, the subject matter of one or any combination of Aspects 3-6 optionally includes an SAR that is an 8-bit SAR circuit.

In Aspect 8, the subject matter of one or any combination of Examples 1-7 optionally includes an avalanche photodiode (APD); and a first current mirror circuit operatively coupled to the APD, wherein the first current mirror circuit includes a diode-connected transistor configured to provide the input voltage to the pre-amplifying transistor.

In Aspect 9, the subject matter of Aspect 8 optionally includes a resistive circuit element coupled to the emitter of the pre-amplifying transistor; a voltage shifter circuit coupled to the base of the pre-amplifying transistor; and a second current mirror coupled to the voltage shifter circuit and the first current mirror.

In Aspect 10, the subject matter of Aspect 9 optionally includes the first current mirror circuit including a Wilson current mirror circuit.

Aspect 11 can include subject matter (such as a method comprising acts to operate a current monitoring circuit), or can optionally be combined with one or any combination of Aspects 1-10 to include such subject matter, comprising applying a logarithmically varying input voltage to a base of a pre-amplifying transistor; applying an output voltage from a digital-to-analog converter (DAC) circuit to an emitter of the pre-amplifying transistor; applying a reference current source to a collector of the pre-amplifying transistor to establish a threshold voltage and to pull a collector voltage at the collector to a high supply voltage, wherein the collector voltage is pulled down to a low supply voltage when a difference between the logarithmically varying input voltage and the output voltage from the DAC circuit is greater than the established threshold voltage; and generating a digital value for the logarithmically varying input voltage using the collector voltage as an input to a quantizer circuit that includes the DAC circuit.

In Aspect 12, the subject matter of Aspect 11 optionally includes generating a current using an avalanche photodiode (APD); and converting the current to the input voltage applied to the base of the pre-amplifying transistor, wherein the input voltage varies logarithmically with the current.

In Aspect 13, the subject matter of Aspect 12 optionally includes generating an APD current that varies over four decades of a logarithmic current scale; and generating digital values that are logarithmically compressed digital values of the APD current.

Aspect 14 includes subject matter (such as on optical receiver circuit) or can optionally be combined with one or any combination of Aspects 1-13 to include such subject matter, comprising an avalanche photodiode (APD); an APD current monitoring circuit, and a quantizer circuit. The APD current monitoring circuit includes a converter circuit configured to convert an APD current received from the APD to an input voltage that varies logarithmically with the APD current; and a pre-amplifying transistor including a base, an emitter and a collector. The pre-amplifying transistor is configured to receive the input voltage at the base and produce an output voltage at the collector according to a comparison of a reference voltage and a difference between the input voltage and a voltage at the emitter. The quantizer circuit is operatively coupled to the pre-amplifying transistor and is configured to generate a digital value for the APD current using the output voltage produced by the pre-amplifying transistor.

In Aspect 15, the subject matter of Aspect 14 optionally includes a converter circuit that includes a diode-connected transistor.

In Aspect 16, the subject matter of one or both of Aspects 14 and 15 optionally includes a quantizer circuit that includes a successive approximation register (SAR) converter circuit.

In Aspect 17, the subject matter of Aspect 16 optionally includes an SAR converter circuit that includes a comparator circuit coupled to the collector of the pre-amplifying transistor and a digital to analog converter (DAC) circuit that includes a DAC output coupled to the emitter of the pre-amplifying transistor.

In Aspect 18, the subject matter of Aspect 17 optionally includes a resistive circuit element coupled to the emitter of the pre-amplifying transistor and the output of the DAC circuit; and a voltage shifter circuit coupled to the base of the pre-amplifying transistor and an input of the comparator.

In Aspect 19, the subject matter of one or both of Aspects 17 and 18 optionally includes a proportional to absolute temperature (PTAT) voltage reference coupled to an input of the DAC circuit.

In Aspect 20, the subject matter of one or any combination of Aspects 14-19 optionally includes a quantizer circuit configured to generate an 8-bit digital value representing the APD current, wherein the APD varies over four decades of a logarithmic scale.

In Aspect 21, the subject matter of one or any combination of Aspects 14-20 optionally includes a converter circuit that includes a current mirror circuit operatively coupled to the APD, wherein the current mirror circuit includes a first current mirror transistor including a collector to receive the APD current and a base coupled to a second current mirror transistor, wherein the second current mirror transistor is diode-connected and provides the input voltage to the pre-amplifying transistor.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples" or "aspects." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic circuit comprising an analog-to-digital converter (ADC) circuit, the ADC circuit including:
   a pre-amplifying transistor including a base, an emitter and a collector, the pre-amplifying transistor configured to:
      receive an input voltage at the base; and
      produce an output voltage at the collector according to a comparison of a reference voltage and a difference between the input voltage and a voltage at the emitter; and
   a quantizer circuit operatively coupled to the emitter of the pre-amplifying transistor and configured to generate a digital value for the input voltage using the output voltage produced by the pre-amplifying transistor.

2. The electronic circuit of claim 1, including:
   an avalanche photodiode (APD); and
   a diode-connected transistor operatively coupled to the APD and configured to receive current produced by the APD and generate the input voltage received at the base of the pre-amplifying transistor, wherein the input voltage varies logarithmically with the current produced by the APD.

3. The electronic circuit of claim 1, wherein the quantizer circuit includes a successive approximation register (SAR) converter circuit.

4. The electronic circuit of claim 3,
   wherein the SAR converter circuit includes a digital-to-analog converter (DAC) circuit including a DAC output operatively coupled to the emitter of the pre-amplifying transistor; and
   wherein the pre-amplifying circuit is configured to produce the output voltage using a difference between the input voltage and a DAC output voltage.

5. The electronic circuit of claim 4, including:
   a resistive circuit element coupled to the emitter of the pre-amplifying transistor and an output of the DAC circuit; and
   a voltage shifter circuit coupled to the base of the pre-amplifying transistor.

6. The electronic circuit of claim 4, including a proportional to absolute temperature (PTAT) voltage reference coupled to an input of the DAC circuit.

7. The electronic circuit of claim 3, wherein the SAR circuit is an 8-bit SAR circuit.

8. The electronic circuit of claim 1, including:
   an avalanche photodiode (APD); and
   a first current mirror circuit operatively coupled to the APD, wherein the first current mirror circuit includes a diode-connected transistor configured to provide the input voltage to the pre-amplifying transistor.

9. The electronic circuit of claim 8, including:
   a resistive circuit element coupled to the emitter of the pre-amplifying transistor;
   a voltage shifter circuit coupled to the base of the pre-amplifying transistor; and
   a second current mirror coupled to the voltage shifter circuit and the first current mirror.

10. The electronic circuit of claim 9, wherein the first current mirror circuit includes a Wilson current mirror circuit.

11. A method of operating a current monitoring circuit, the method comprising:
    applying a logarithmically varying input voltage to a base of a pre-amplifying transistor;
    applying an output voltage from a digital-to-analog converter (DAC) circuit to an emitter of the pre-amplifying transistor;
    applying a reference current source to a collector of the pre-amplifying transistor to establish a threshold voltage and to pull a collector voltage at the collector to a high supply voltage, wherein the collector voltage is pulled down to a low supply voltage when a difference between the logarithmically varying input voltage and the output voltage from the DAC circuit is greater than the established threshold voltage; and
    generating a digital value for the logarithmically varying input voltage using the collector voltage as an input to a quantizer circuit that includes the DAC circuit.

12. The method of claim 11, including:
    generating a current using an avalanche photodiode (APD); and
    converting the current to the input voltage applied to the base of the pre-amplifying transistor, wherein the input voltage varies logarithmically with the current.

13. The method of claim 12,
    wherein generating the current includes generating an APD current that varies over four decades of a logarithmic current scale; and
    wherein generating the digital value includes generating digital values that are logarithmically compressed digital values of the APD current.

14. An optical receiver circuit comprising:
    an avalanche photodiode (APD);
    an APD current monitoring circuit including:
       a converter circuit configured to convert an APD current received from the APD to an input voltage that varies logarithmically with the APD current; and
       a pre-amplifying transistor including a base, an emitter and a collector, the pre-amplifying transistor configured to:
          receive the input voltage at the base; and
          produce an output voltage at the collector according to a comparison of a reference voltage and a difference between the input voltage and a voltage at the emitter; and
       a quantizer circuit operatively coupled to the pre-amplifying transistor and configured to generate a digital value for the APD current using the output voltage produced by the pre-amplifying transistor.

15. The optical receiver circuit of claim 14, wherein the converter circuit includes a diode-connected transistor.

16. The optical receiver circuit of claim 14, wherein the quantizer circuit includes a successive approximation register (SAR) converter circuit.

17. The optical receiver circuit of claim 16, wherein the SAR converter circuit includes:
    a comparator circuit coupled to the collector of the pre-amplifying transistor; and
    a digital to analog converter (DAC) circuit including a DAC output coupled to the emitter of the pre-amplifying transistor.

18. The optical receiver circuit of claim 17, including:
    a resistive circuit element coupled to the emitter of the pre-amplifying transistor and the output of the DAC circuit; and
    a voltage shifter circuit coupled to the base of the pre-amplifying transistor and an input of the comparator.

19. The optical receiver circuit of claim 17, including a proportional to absolute temperature (PTAT) voltage reference coupled to an input of the DAC circuit.

20. The optical receiver circuit of claim 14, wherein the quantizer circuit is configured to generate an 8-bit digital value representing the APD current, wherein the APD varies over four decades of a logarithmic scale.

21. The optical receiver circuit of claim 14, wherein the converter circuit includes:
- a current mirror circuit operatively coupled to the APD, wherein the current mirror circuit includes a first current mirror transistor including a collector to receive the APD current and a base coupled to a second current mirror transistor, wherein the second current mirror transistor is diode-connected and provides the input voltage to the pre-amplifying transistor.

* * * * *